United States Patent
Lee et al.

(10) Patent No.: US 11,022,657 B2
(45) Date of Patent: Jun. 1, 2021

(54) PROCESSOR AND CHIPSET CONTINUITY TESTING OF PACKAGE INTERCONNECT FOR FUNCTIONAL SAFETY APPLICATIONS

(71) Applicant: Intel Corporation, Santa Clara, CA (US)

(72) Inventors: Matthew Lee, Chandler, AZ (US); Benedict C. Ofuonye, Chandler, AZ (US); Erich Ewy, Chandler, AZ (US); Jeffrey Willcoxon, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 252 days.

(21) Appl. No.: 16/020,507

(22) Filed: Jun. 27, 2018

(65) Prior Publication Data
US 2019/0049510 A1 Feb. 14, 2019

(51) Int. Cl.
*G01R 31/28* (2006.01)
*G01R 31/71* (2020.01)
*H01L 23/498* (2006.01)

(52) U.S. Cl.
CPC ......... *G01R 31/71* (2020.01); *G01R 31/2853* (2013.01); *H01L 23/49816* (2013.01); *G01R 31/2879* (2013.01); *G01R 31/2896* (2013.01); *H05K 2203/041* (2013.01)

(58) Field of Classification Search
CPC .......................... G01R 31/26; G01R 31/2642; G01R 31/2648; G01R 31/2831; G01R 31/31702
See application file for complete search history.

(56) References Cited

U.S. PATENT DOCUMENTS

2005/0156304 A1\* 7/2005 Furuyama ............ H05K 1/0268
                                                                257/686
2016/0282896 A1\* 9/2016 Edwards ................... G05F 5/00

FOREIGN PATENT DOCUMENTS

CN        110647413 A    1/2020
DE   10 2019 112 633 A1  1/2020

OTHER PUBLICATIONS

Artur Jutman, "At-Speed On-Chip Diagnosis of Board-Level Interconnect Faults," Symposium, 2004, 6 pages, Proceedings Ninth IEEE European Test Symposium.
Tulloss, et al., "BIST & Boundary-Scan for Board Level Test: Test Program Pseudocode," paper, 1989, 6 pages, IEEE.

(Continued)

*Primary Examiner* — Tung X Nguyen
(74) *Attorney, Agent, or Firm* — Spectrum IP Law Group LLC

(57) ABSTRACT

Methods and apparatus relating to processor and chipset continuity testing of package interconnect for functional safety applications are described. In an embodiment, voltage divider logic circuitry divides a reference voltage. Controller logic circuitry compares a divided voltage value from a node of the voltage divider logic circuitry and a threshold voltage value. A first end of the voltage divider logic circuitry is coupled to receive the reference voltage and a second end of the voltage divider logic circuitry is coupled to a Non-Critical-To-Function (NCTF) solder ball. The controller logic circuitry generates an error signal in response to a mismatch between the divided voltage value and the threshold voltage value. Other embodiments are also disclosed and claimed.

25 Claims, 7 Drawing Sheets

(56) References Cited

OTHER PUBLICATIONS

"Boundary-Scan for PCB Interconnect Testing and In-System Programming of CPLDs and Flash Memories," paper, 7 pages, Corelis, Cerritos, CA.

De Jong, et al., "Boundary Scan Test, Test Methodology, and Fault Modeling," Journal, 1991, 12 pages, Kluwer Academic Publishers, The Netherlands.

Wrona, et al., "Early Failure Detection in Fatigue Tests of BGA Packages," book, 2007, pp. 298-302, Springer-Verlag, Germany.

Chen, et al., "The Experimental Study for the Solder Joint Reliability of High I/O FCBGAs With Thermal Loaded Bend Test," Journal, Mar. 2006, pp. 198-203, vol. 29, No. 1, IEEE.

"JTAG/Boundary Scan—Design for Testability: Foresighted Board Level Design for Optimal Testability," catalog, 32 pages, GOPEL Electronic, Germany.

Kumar et al., "A Novel Method for Diagnosis of Board Level Interconnect Faults Using Boundary Scan," Conference, 2010, 6 pages, IEEE.

\* cited by examiner

US 11,022,657 B2

PROCESSOR AND CHIPSET CONTINUITY TESTING OF PACKAGE INTERCONNECT FOR FUNCTIONAL SAFETY APPLICATIONS

FIELD

The present disclosure generally relates to the field of electronics. More particularly, an embodiment relates to processor and chipset continuity testing of package interconnect for functional safety applications.

BACKGROUND

Functional Safety (FuSa) is important for real-time complex systems including systems used for IOT (Internet Of Things) applications (such as automotive and industrial segments). Such applications may impose tight constraints on the system to perform safely and reliably under complex system environments.

For example, both ISO (International Organization for Standardization) 26262 (for automobiles, first defined in 2011) and IEC (International Electrotechnical Commission) 61508 (for industrial applications, first defined in 2010) FuSa standards require diagnostic coverages close to and beyond 99% for the higher safety integrity levels, e.g., A(SIL) (where A stands for Automotive and SIL stands for Safety Integrity Level). For example, SIL 3 may be used for IEC 61508 and ASIL C and D may be used for ISO 26262. Hence, meeting FuSa can be complicated and difficult for real-time systems.

BRIEF DESCRIPTION OF THE DRAWINGS

The detailed description is provided with reference to the accompanying figures. In the figures, the left-most digit(s) of a reference number identifies the figure in which the reference number first appears. The use of the same reference numbers in different figures indicates similar or identical items.

DETAILED DESCRIPTION

Figure 1:
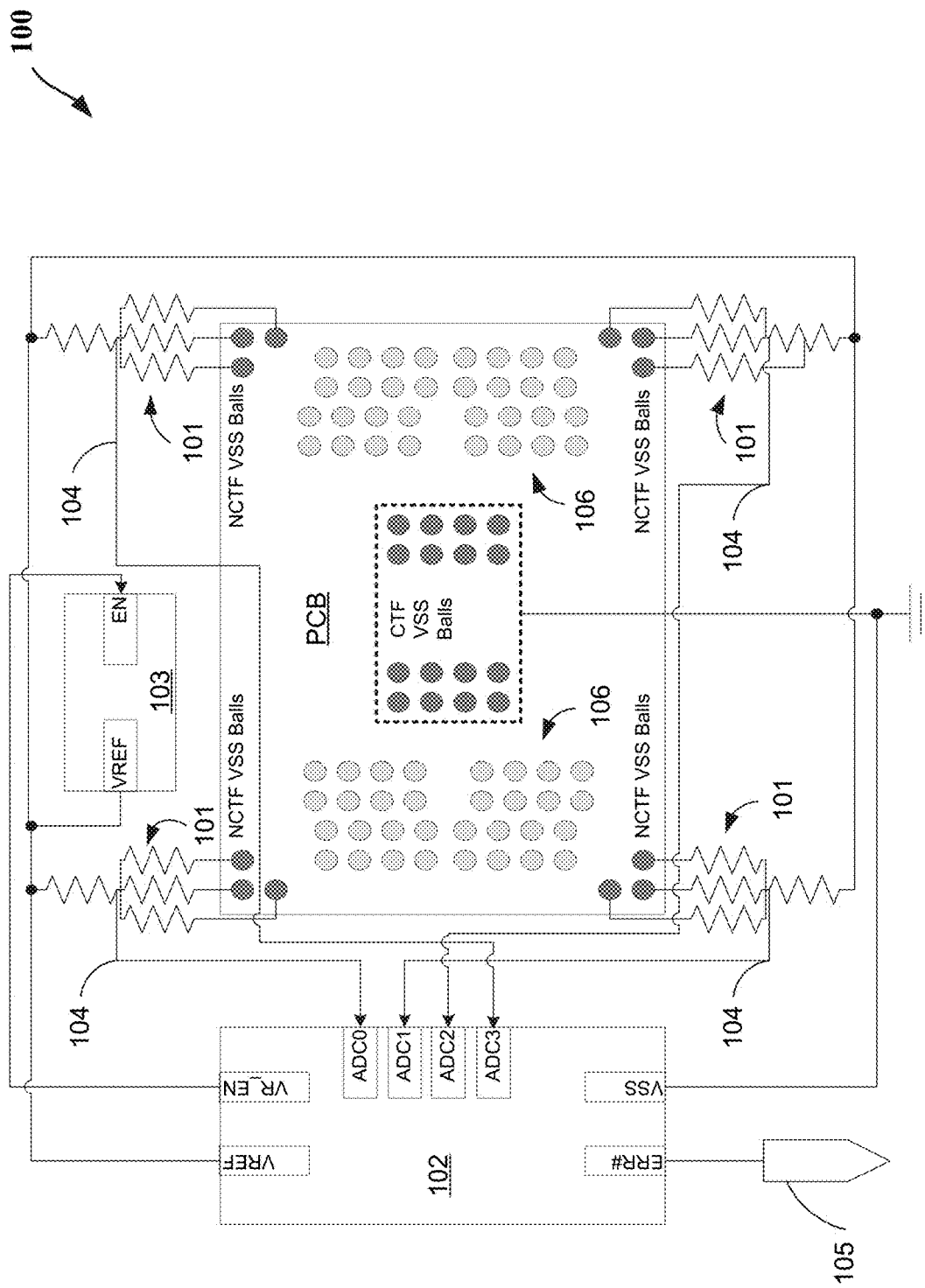
FIG. 1 illustrates a diagram of a continuity test circuit, according to an embodiment.

In the following description, numerous specific details are set forth in order to provide a thorough understanding of various embodiments. However, various embodiments may be practiced without the specific details. In other instances, well-known methods, procedures, components, and circuits have not been described in detail so as not to obscure the particular embodiments. Further, various aspects of embodiments may be performed using various means, such as integrated semiconductor circuits ("hardware"), computer-readable instructions organized into one or more programs ("software"), or some combination of hardware and software. For the purposes of this disclosure reference to "logic" shall mean either hardware (such as logic circuitry or more generally circuitry or circuit), software, firmware, or some combination thereof.

As mentioned above, meeting FuSa can be complicated and difficult for real-life systems. Moreover, semiconductor package diagnostic coverages are usually absent in most Integrated Circuits (ICs), including processors and chipsets, and this creates a challenge when attempting to meet target levels of detectability for functional safety standards.

To this end, some embodiments relate to processor and chipset continuity testing of (e.g., semiconductor) package interconnect for functional safety applications. To this end, techniques discussed herein may address safety concerns by providing a functional safety. In an embodiment, voltage divider logic circuitry divides a reference voltage. Controller logic circuitry compares a divided voltage value from a node of the voltage divider logic circuitry and a threshold voltage value. A first end of the voltage divider logic circuitry is coupled to receive the reference voltage and a second end of the voltage divider logic circuitry is coupled to a Non-Critical-To-Function (NCTF) solder ball. The controller logic circuitry generates an error signal in response to a mismatch between the divided voltage value and the threshold voltage value.

For example, NCTF VSS IC package solder balls may be used as a continuity test point to provide diagnostic coverage for when the IC may become detached from the mainboard due to solder ball failure. Moreover, the NCTF VSS IC solder balls are repurposed to indicate a potential break point in the VSS-to-Ground circuit in some embodiments. As discussed herein, "Vss" or "VSS" generally refers to the most negative supply terminal for an IC or a circuit (sometimes referred to as "ground"). Continuity can be measured as the voltage at the center node of a voltage potential divider connected to the NCTF VSS mainboard pads. The ability to detect select package failure modes can allow for certain package diagnostic coverage levels used in FuSa applications and boost overall component level diagnostic coverage—a target outcome in meeting A(SIL) diagnostic coverage metrics.

Moreover, failure of solder balls tend to happen first at the package corner due to temperature cycling, mainboard flexing, or mechanical shock. Most processors and chipsets packages have NCTF balls at each corner of the package and these are, therefore, a candidate for detecting solder ball failure. The function of NCTF balls has some variation between packages with some possibly being unconnected and some possibly being used for signals. A consistent NCTF ball function, however, across different processors and chipsets is part of the package VSS plane.

Since VSS is a consistent function, NCTF VSS balls can be a vector/source for continuity testing. In order to use this vector, an embodiment would isolate some or all of the NCTF VSS balls on the mainboard from the VSS plane. Instead, these balls are connected to a continuity test circuit that checks if the pad that connects to the ball is connected to the mainboard VSS plane through the PCB/package components (e.g., processor or chipset). In turn, lack of continuity to the mainboard VSS plane indicates a solder ball failure.

FIG. 1 illustrates a diagram of a continuity test circuit 100, according to an embodiment. The continuity test circuit 100 includes: a resistor-based voltage potential divider 101 for the NCTF VSS balls in each package corner or Printed Circuit Board (PCB) corner (where PCB is also referred to herein interchangeably as "main board" or "motherboard"); a microcontroller (or controller logic) 102 (e.g., with one or more integrated ADCs (Analog-to-Digital Converters)) to measure voltage value(s) at the center node of the potential dividers 101; and a voltage regulator 103 that supplies the reference voltage (VREF) for the potential divider(s) 101, ADC(s), and controller logic 102. The microcontroller 102 generates a signal (ERR #) to cause an appropriate action based on the measured voltage values and their comparison against VSS.

In FIG. 1, the dark shaded circles indicate the location of the VSS balls (and the Critical To Function (CTF) balls are shown in the center of the PCB, whereas the NCTF balls are shown in the periphery of the PCB). The light shaded circles 106 represent other ball functions. Also, while logic 102 is shown with integrated ADCs, one or more of the ADCs may be implemented in a component outside of the logic 102 and communicatively coupled to the logic 102 instead. Additionally, even though FIG. 1 shows four ADCs, more or less ADCs may be used depending on the implementation and/or the number of NCTF VSS balls present on a PCB. In an embodiment, one ADC may be used for each NCTF VSS ball present. Further, the PCB or package may include (or have mounted thereon) one or more of: a processor (e.g., having one or more processor cores), a chipset (e.g., including communication logic, such as one or more of: an I/O interface, a display controller, a memory controller, and/or an I/O controller hub discussed herein with reference to other figures), memory device (not shown in FIG. 1 but shown in other figures like FIG. 4), etc.

In an embodiment, the resistor value for the dividers 101 can be chosen to minimize power consumption to acceptable values for system. 1 kΩ may be used, e.g., to align with some industry standards on solder joint resistance. Also, the resistor tolerance can be chosen to allow accurate interpretation of measured voltage. In one embodiment, all resistors used for dividers 101 have the same value and tolerance. In an embodiment, VREF signal is assumed to be derived from an available (e.g., always on) rail in the system. The enabled state of the VREF signal (e.g., as asserted by VR_EN signal generated by the controller logic 102) may vary depending on the needs for system diagnostics. Also, the microcontroller 102 may be implemented as a processor (e.g., having one or more processor cores), an FPGA (Field-Programmable Gate Array), an ultra-low power standalone IC device, or as part of multi-function semiconductor device such as an Embedded Controller (EC), or a Board Management Controller (BMC).

In some embodiments, the expected state of the solder joints for the VSS NCTF signals are defined by the resistance of those joints as: (a) Good: a resistance value of about 0Ω; (b) Marginal: a resistance value greater than about 0Ω and less than about 1 kΩ, and (c) Failed: resistance value of about 1 kΩ or larger. In one or more embodiments, the value of 1 kΩ is used as an example since the IPC-9701A (2006) standard defines a failed solder joint as having a resistance of less than or equal to 1 kΩ. Also, while one or more embodiments are discussed with reference to a threshold resistance value of about 1 kΩ (e.g., to align with some industry standards on solder joint resistance), other threshold resistance values may be used depending on the implementation.

Considering the above solder joint states, and assuming that 1 kOhm resistors are used in potential dividers, the expected voltage at the center node 104 of each potential divider 101 may be defined as follows:

$$\text{Good: } V \cong \frac{VREF}{\#\text{Resistors in divider}}$$

$$\text{Marginal: } V > \frac{VREF}{\#\text{Resistors in divider}} \text{ AND}$$

$$V < \frac{2 \times VREF}{\#\text{Resistors in divider} + 1}$$

$$\text{Failed: } V \geq \frac{2 \times VREF}{\#\text{Resistors in divider} + 1}$$

Based on the measurement of a Good, Marginal or Failed state, the controller logic 102 can cause the appropriate system actions by generating an error signal 105 (e.g., via a pin 105). the error signal 105 may indicate one or more types of error by using a designated error number (which may be one or more bits in some embodiments).

Figure 2:
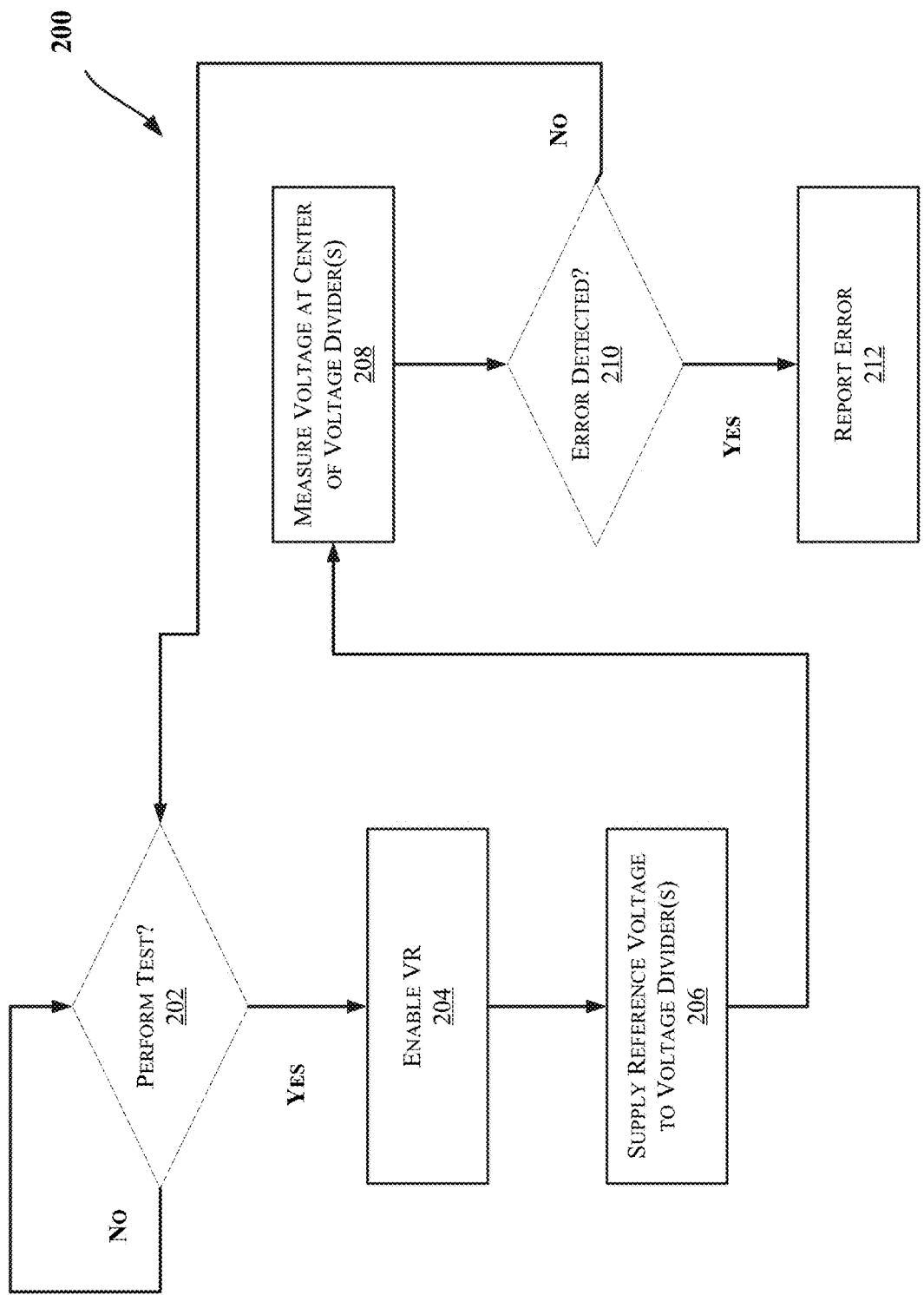
FIG. 2 illustrates a flow diagram of a method for continuity testing of package interconnect for functional safety applications, according to an embodiment.

FIG. 2 illustrates a flow diagram of a method 200 for continuity testing of package interconnect for functional safety applications, according to an embodiment. One or more operations of method 200 may be performed by logic (e.g., logic 102 and/or 103 of FIG. 1) and/or one or more components discussed herein with reference to FIG. 1 et seq. (such as an ultra-low power standalone IC, as part of multi-function IC such as an Embedded Controller (EC), Board Management Controller (BMC), a processor (e.g., having one or more processor cores), an FPGA, etc.).

Referring to FIGS. 1-2, operation 202 (e.g., at logic 102) determines whether a test should be performed, e.g., for functional safety of components of a PCB (such as a processor and/or chipset). Operation 204 (e.g., at logic 102) enables a Voltage Regulator (VR) (e.g., logic 103), for example via a signal (e.g., VR-EN). Operation 206 (e.g., at logic 103) supplies a reference voltage (e.g., VREF) to voltage divider(s) (e.g., divider(s) 101) and/or logic 102 in response to the enablement of the VR at operation 204. Operation 208 (e.g., at one or more of ADCs of logic 102) measures/detects voltages at center of voltage divider(s) (e.g., at one or more of nodes 104). Operation 210 (e.g., at logic 102) determines whether an error or potential failure exists. Operation 212 (e.g., at logic 102) reports any errors for further handling.

In another embodiment, functional safety in automotive and/or industrial applications is provided by adding Diagnostic Coverage (DC), which eliminates the BGA (Ball Grid Array) interconnect as a "single-point fault" by implementing package test structures, external sense circuitry, and watchdog logic. One embodiment provides Critical-To-Function Daisy Chain (CTF-DC) pairs, at strategic package locations, that become one-half of a voltage divider circuit tied to ground. Over time, as the CTF-DC pairs begin to fatigue or crack, the increase in resistance will result in an increase in voltage, which, upon reaching a pre-determined threshold, will signal watchdog logic as either a warning or fault condition being imminent.

In terms of the ISO 26262 standard, an embodiment adds "diagnostic coverage" for interconnect (e.g., BGA) and semiconductor package related faults through the use of test structures designed into the substrate, along with external circuitry to monitor the test structures. Interconnect failure can occur due to temperature cycling, humidity, and mechanical stresses. Over time, any of these mechanisms can lead to a non-functioning PCB or System on Chip (SoC or SOC). Moreover, such faults are referred to as a "single point fault" by the ISO 26262 definition, meaning that there is no diagnostic coverage. To this end, some embodiments provide a FMEDA (Failure Modes and Effects Diagnostic Analysis) consistent with the ISO 26262 standard, which can provide packaging-related failure modes that are ten to hundred fold greater than what the standard may ask for.

To address this gap, diagnostic coverage can be added to cover key failure mechanisms through the use of package test structures, external or internal sense circuitry, and watchdog logic. The test structures may be one or more of: low resistance traces (e.g., that are connected to each other or daisy chained) and/or physical substrate features (such as vias, resistance patterns, BGA pads, etc.) that are electrically coupled to the sense circuitry. Upon failure (or approaching failure), the resistance of these structures (e.g., as measured/detected by the sense circuitry) change indicating an impending fault, signaling the watchdog. In this manner the system is in a fail-safe operational mode and the safety goal(s) are not violated.

Figure 3:
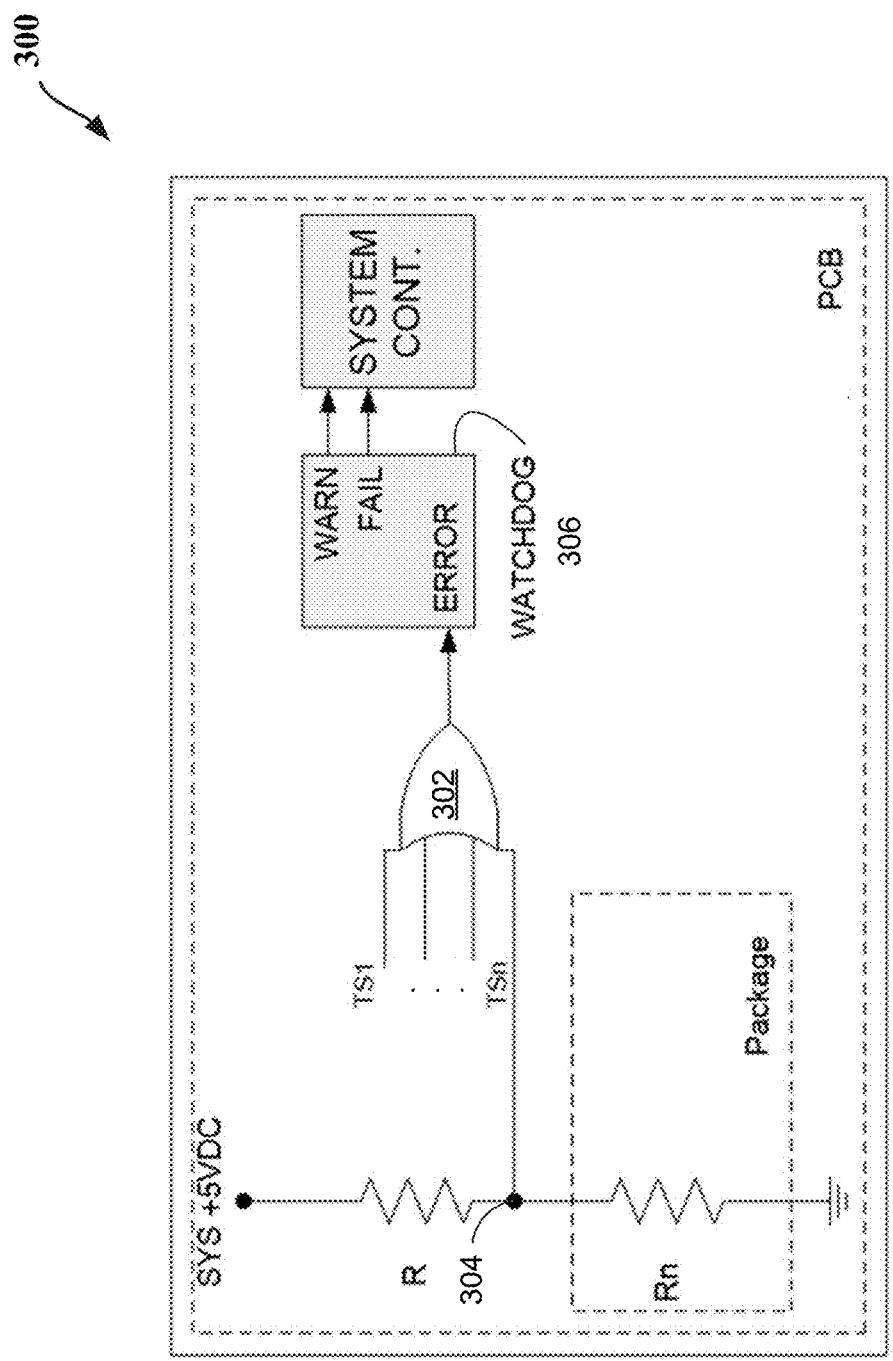
FIG. 3 shows diagram of a sense circuitry, according to an embodiment.

FIG. 3 shows diagram of a sense circuitry 300, according to an embodiment. Each Test Structure (TS) is represented by resistor Rn in FIG. 3. The value of the resistor R for a particular test structure is determined by the specific threshold resistance of Rn. Under normal operation, the voltage at the OR gate 302 is near zero. Upon failure, Rn increases and the voltage divider of R+Rn (at node 304) sends a high signal to the OR gate 302, which sends a (e.g., high depending on the implementation) signal to the watchdog 306. The watchdog logic 306 in turn sends a warning or failure signal to a system controller for further handling.

As an example, consider the BGA interconnect test structure. The IPC 9701 standard considers an interconnect fail when resistance exceeds 1000 Ohms. The OR gate threshold for an active condition is 1.0V. The current through the test structure is 1 mA, and with a +5 VDC system supply, the value of R should be 4 kilo Ohms.

Aside from providing real-time diagnostic coverage during field use, the same CTF-DC circuits can be used for time-zero manufacturing checks (solder joint quality) or start-up checks (like Joint Test Action Group (JTAG) checks).

Figure 4:
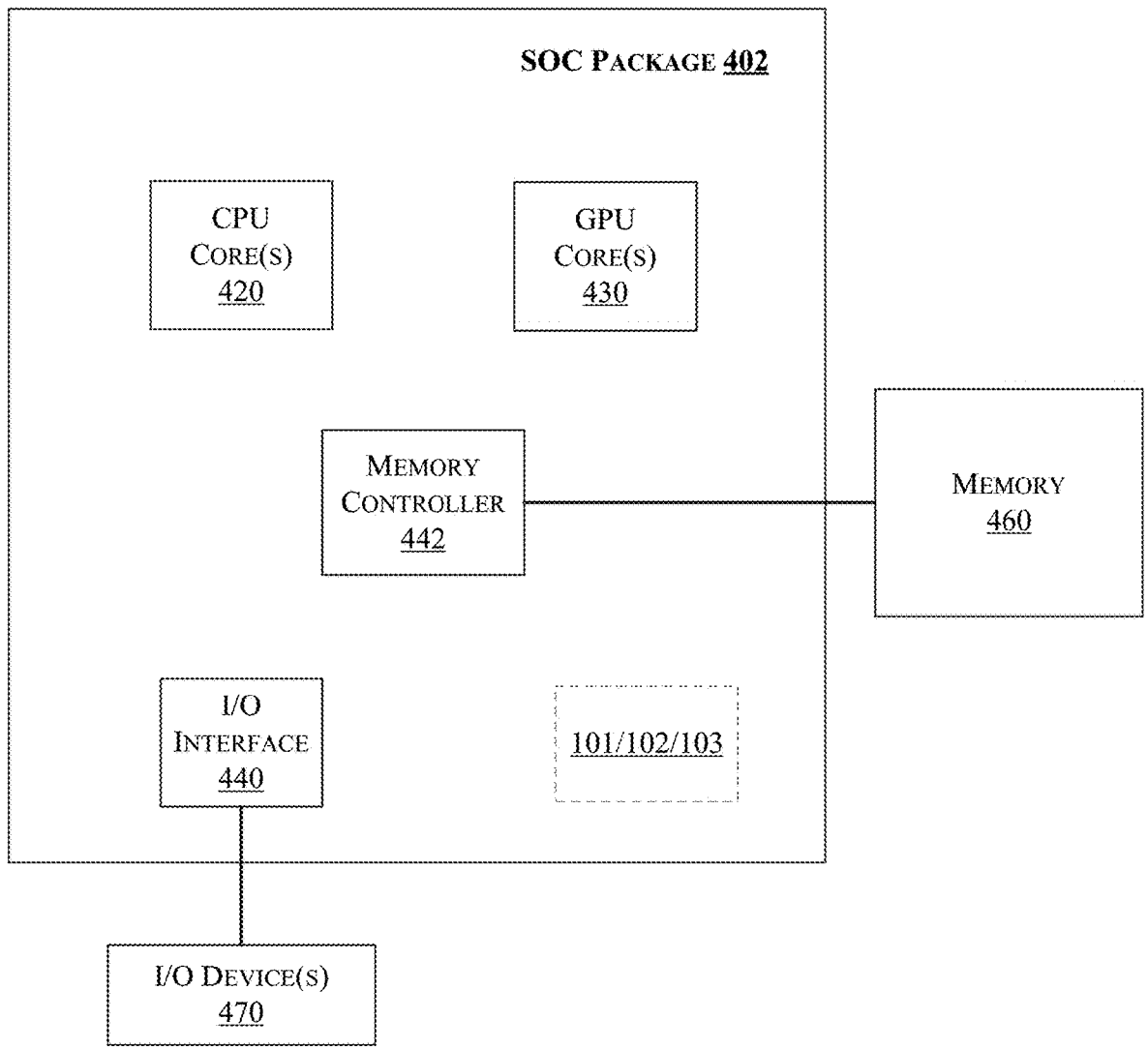
FIGS. 4 and 5 illustrates block diagrams of embodiments of computing systems, which may be utilized in various embodiments discussed herein.

FIG. 4 illustrates a block diagram of an SOC package in accordance with an embodiment. As illustrated in FIG. 4, SOC 402 includes one or more Central Processing Unit (CPU) cores 420, one or more Graphics Processor Unit (GPU) cores 430, an Input/Output (I/O) interface 440, and a memory controller 442. Various components of the SOC package 402 may be coupled to an interconnect or bus such as discussed herein with reference to the other figures. Also, the SOC package 402 may include more or less components, such as those discussed herein with reference to the other figures. Further, each component of the SOC package 420 may include one or more other components, e.g., as discussed with reference to the other figures herein. In one embodiment, SOC package 402 (and its components) is provided on one or more Integrated Circuit (IC) die, e.g., which are packaged into a single semiconductor device.

As illustrated in FIG. 4, SOC package 402 is coupled to a memory 460 via the memory controller 442. In an embodiment, the memory 460 (or a portion of it) can be integrated on the SOC package 402.

The I/O interface 440 may be coupled to one or more I/O devices 470, e.g., via an interconnect and/or bus such as discussed herein with reference to other figures. I/O device(s) 470 may include one or more of a keyboard, a mouse, a touchpad, a display, an image/video capture device (such as a camera or camcorder/video recorder), a touch screen, a speaker, or the like.

Figure 5:
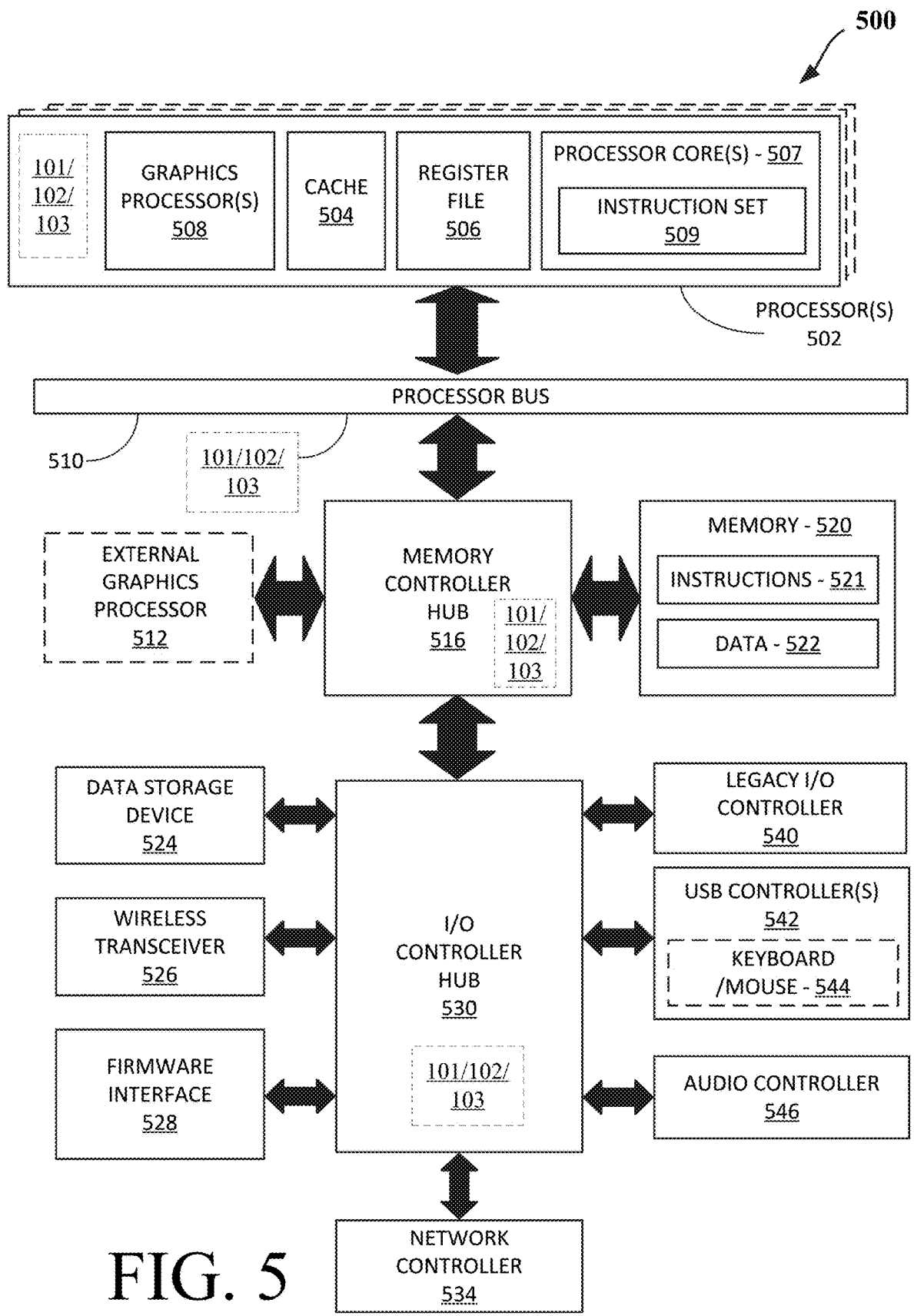

FIG. 5 is a block diagram of a processing system 500, according to an embodiment. In various embodiments the system 500 includes one or more processors 502 and one or more graphics processors 508, and may be a single processor desktop system, a multiprocessor workstation system, or a server system having a large number of processors 502 or processor cores 507. In on embodiment, the system 500 is a processing platform incorporated within a system-on-a-chip (SoC or SOC) integrated circuit for use in mobile, handheld, or embedded devices.

An embodiment of system 500 can include, or be incorporated within a server-based gaming platform, a game console, including a game and media console, a mobile gaming console, a handheld game console, or an online game console. In some embodiments system 500 is a mobile phone, smart phone, tablet computing device or mobile Internet device. Data processing system 500 can also include, couple with, or be integrated within a wearable device, such as a smart watch wearable device, smart eyewear device, augmented reality device, or virtual reality device. In some embodiments, data processing system 500 is a television or set top box device having one or more processors 502 and a graphical interface generated by one or more graphics processors 508.

In some embodiments, the one or more processors 502 each include one or more processor cores 507 to process instructions which, when executed, perform operations for system and user software. In some embodiments, each of the one or more processor cores 507 is configured to process a specific instruction set 509. In some embodiments, instruction set 509 may facilitate Complex Instruction Set Computing (CISC), Reduced Instruction Set Computing (RISC), or computing via a Very Long Instruction Word (VLIW). Multiple processor cores 507 may each process a different instruction set 509, which may include instructions to facilitate the emulation of other instruction sets. Processor core 507 may also include other processing devices, such a Digital Signal Processor (DSP).

In some embodiments, the processor 502 includes cache memory 504. Depending on the architecture, the processor 502 can have a single internal cache or multiple levels of internal cache. In some embodiments, the cache memory is shared among various components of the processor 502. In some embodiments, the processor 502 also uses an external cache (e.g., a Level-3 (L3) cache or Last Level Cache (LLC)) (not shown), which may be shared among processor cores 507 using known cache coherency techniques. A register file 506 is additionally included in processor 502 which may include different types of registers for storing different types of data (e.g., integer registers, floating point registers, status registers, and an instruction pointer register). Some registers may be general-purpose registers, while other registers may be specific to the design of the processor 502.

In some embodiments, processor 502 is coupled to a processor bus 510 to transmit communication signals such as address, data, or control signals between processor 502 and other components in system 500. In one embodiment the system 500 uses an exemplary 'hub' system architecture, including a memory controller hub 516 and an Input Output (I/O) controller hub 530. A memory controller hub 516 facilitates communication between a memory device and other components of system 500, while an I/O Controller Hub (ICH) 530 provides connections to I/O devices via a local I/O bus. In one embodiment, the logic of the memory controller hub 516 is integrated within the processor.

Memory device 520 can be a dynamic random access memory (DRAM) device, a static random access memory (SRAM) device, flash memory device, phase-change memory device, or some other memory device having suitable performance to serve as process memory. In one embodiment the memory device 520 can operate as system memory for the system 500, to store data 522 and instructions 521 for use when the one or more processors 502 executes an application or process. Memory controller hub 516 also couples with an optional external graphics processor 512, which may communicate with the one or more graphics processors 508 in processors 502 to perform graphics and media operations.

In some embodiments, ICH 530 enables peripherals to connect to memory device 520 and processor 502 via a high-speed I/O bus. The I/O peripherals include, but are not limited to, an audio controller 546, a firmware interface 528, a wireless transceiver 526 (e.g., Wi-Fi, Bluetooth), a data storage device 524 (e.g., hard disk drive, flash memory, etc.), and a legacy I/O controller 540 for coupling legacy (e.g., Personal System 2 (PS/2)) devices to the system. One or more Universal Serial Bus (USB) controllers 542 connect input devices, such as keyboard and mouse 544 combinations. A network controller 534 may also couple to ICH 530. In some embodiments, a high-performance network controller (not shown) couples to processor bus 510. It will be appreciated that the system 500 shown is exemplary and not limiting, as other types of data processing systems that are differently configured may also be used. For example, the I/O controller hub 530 may be integrated within the one or more processor 502, or the memory controller hub 516 and I/O controller hub 530 may be integrated into a discreet external graphics processor, such as the external graphics processor 512.

Figure 6:
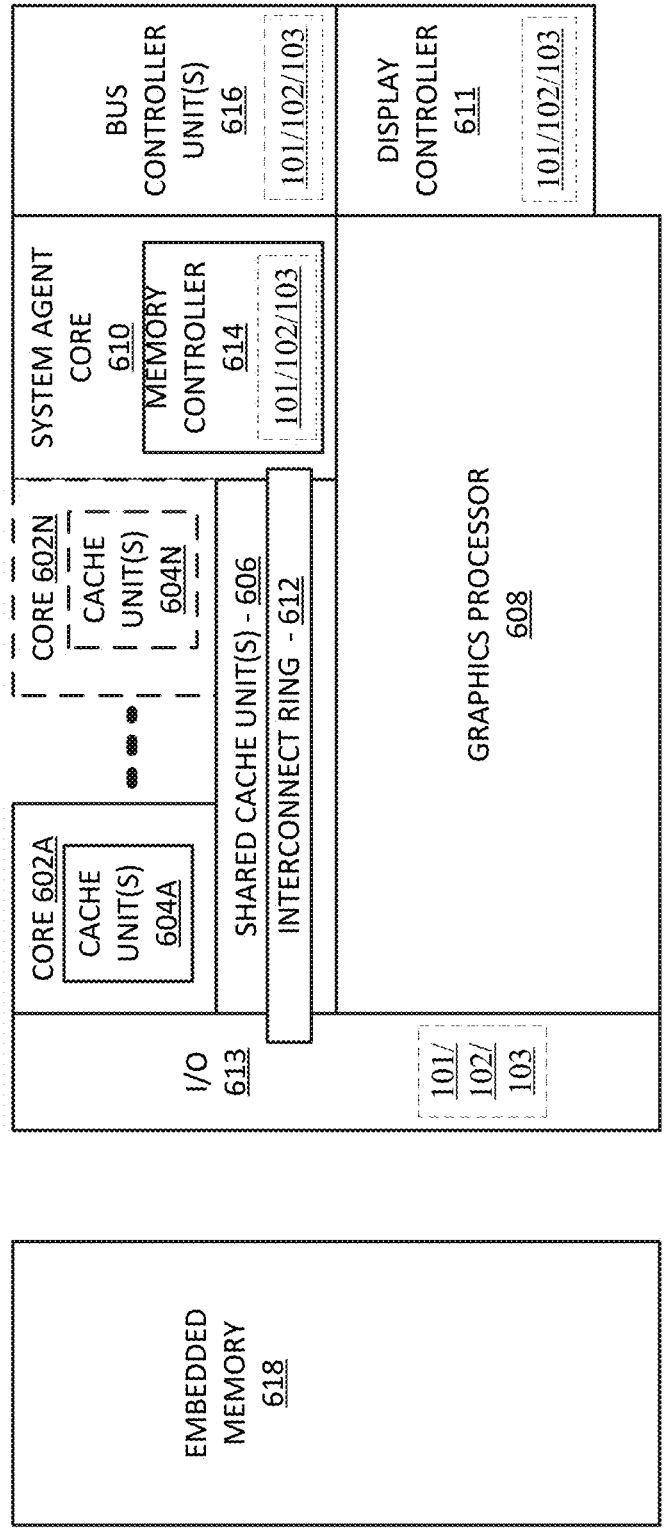
FIGS. 6 and 7 illustrate various components of processors in accordance with some embodiments.

FIG. 6 is a block diagram of an embodiment of a processor 600 having one or more processor cores 602A to 602N, an integrated memory controller 614, and an integrated graphics processor 608. Those elements of FIG. 6 having the same reference numbers (or names) as the elements of any other figure herein can operate or function in any manner similar to that described elsewhere herein, but are not limited to such. Processor 600 can include additional cores up to and including additional core 602N represented by the dashed lined boxes. Each of processor cores 602A to 602N includes one or more internal cache units 604A to 604N. In some embodiments each processor core also has access to one or more shared cached units 606.

The internal cache units 604A to 604N and shared cache units 606 represent a cache memory hierarchy within the processor 600. The cache memory hierarchy may include at least one level of instruction and data cache within each processor core and one or more levels of shared mid-level cache, such as a Level 2 (L2), Level 3 (L3), Level 4 (L4), or other levels of cache, where the highest level of cache before external memory is classified as the LLC. In some embodiments, cache coherency logic maintains coherency between the various cache units 606 and 604A to 604N.

In some embodiments, processor 600 may also include a set of one or more bus controller units 616 and a system agent core 610. The one or more bus controller units 616 manage a set of peripheral buses, such as one or more Peripheral Component Interconnect buses (e.g., PCI, PCI Express). System agent core 610 provides management functionality for the various processor components. In some embodiments, system agent core 610 includes one or more integrated memory controllers 614 to manage access to various external memory devices (not shown).

In some embodiments, one or more of the processor cores 602A to 602N include support for simultaneous multi-threading. In such embodiment, the system agent core 610 includes components for coordinating and operating cores 602A to 602N during multi-threaded processing. System agent core 610 may additionally include a power control unit (PCU), which includes logic and components to regulate the power state of processor cores 602A to 602N and graphics processor 608.

In some embodiments, processor 600 additionally includes graphics processor 608 to execute graphics processing operations. In some embodiments, the graphics processor 608 couples with the set of shared cache units 606, and the system agent core 610, including the one or more integrated memory controllers 614. In some embodiments, a display controller 611 is coupled with the graphics processor 608 to drive graphics processor output to one or more coupled displays. In some embodiments, display controller 611 may be a separate module coupled with the graphics processor via at least one interconnect, or may be integrated within the graphics processor 608 or system agent core 610.

In some embodiments, a ring based interconnect unit 612 is used to couple the internal components of the processor 600. However, an alternative interconnect unit may be used, such as a point-to-point interconnect, a switched interconnect, or other techniques, including techniques well known in the art. In some embodiments, graphics processor 608 couples with the ring interconnect 612 via an I/O link 613.

The exemplary I/O link 613 represents at least one of multiple varieties of I/O interconnects, including an on package I/O interconnect which facilitates communication between various processor components and a high-performance embedded memory module 618, such as an eDRAM (or embedded DRAM) module. In some embodiments, each of the processor cores 602 to 602N and graphics processor 608 use embedded memory modules 618 as a shared Last Level Cache.

In some embodiments, processor cores 602A to 602N are homogenous cores executing the same instruction set architecture. In another embodiment, processor cores 602A to 602N are heterogeneous in terms of instruction set architecture (ISA), where one or more of processor cores 602A to 602N execute a first instruction set, while at least one of the other cores executes a subset of the first instruction set or a different instruction set. In one embodiment processor cores 602A to 602N are heterogeneous in terms of microarchitecture, where one or more cores having a relatively higher power consumption couple with one or more power cores having a lower power consumption. Additionally, processor 600 can be implemented on one or more chips or as an SoC integrated circuit having the illustrated components, in addition to other components.

Figure 7:
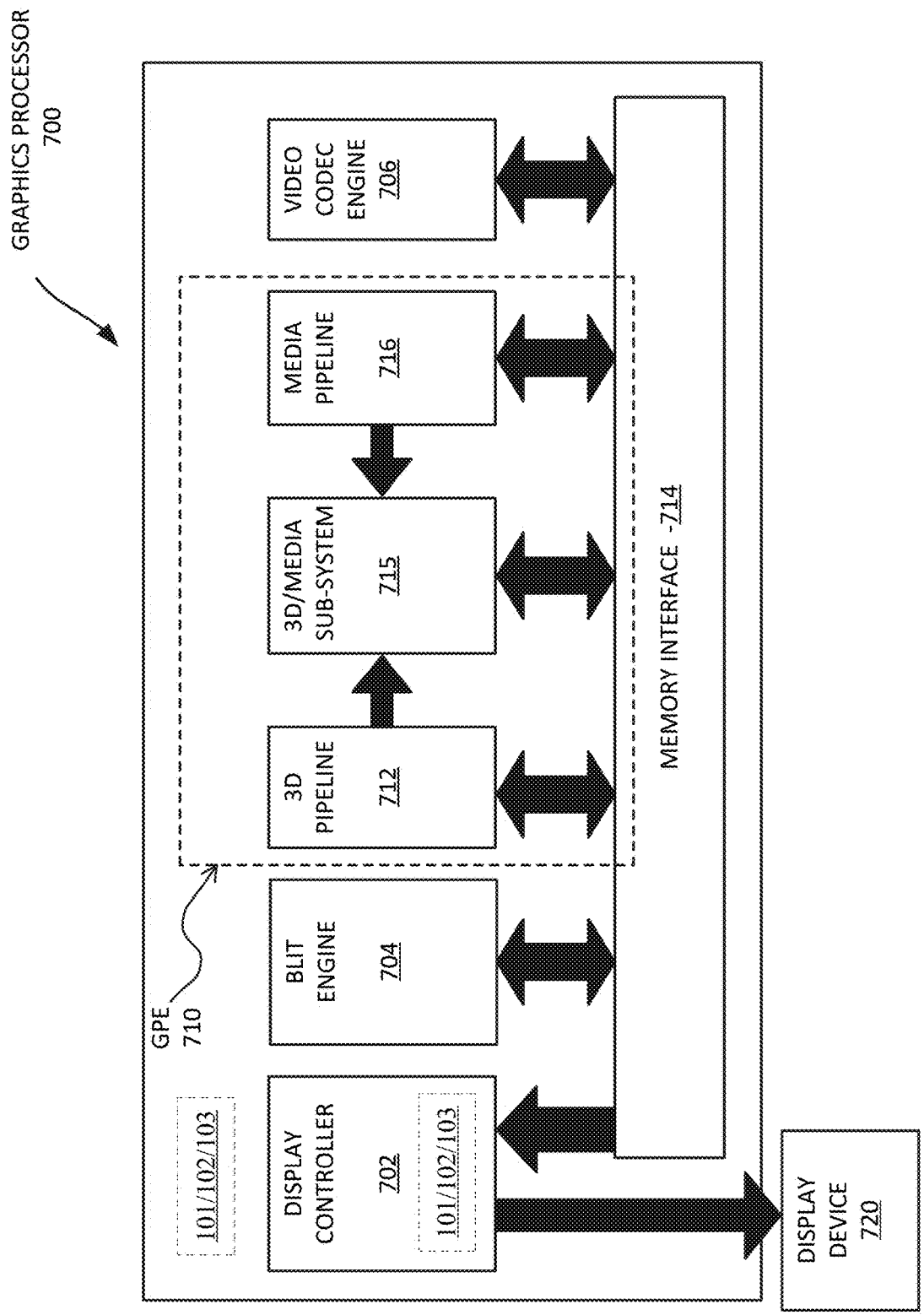

FIG. 7 is a block diagram of a graphics processor 700, which may be a discrete graphics processing unit, or may be a graphics processor integrated with a plurality of processing cores. In some embodiments, the graphics processor communicates via a memory mapped I/O interface to registers on the graphics processor and with commands placed into the processor memory. In some embodiments, graphics processor 700 includes a memory interface 714 to access memory. Memory interface 714 can be an interface to local memory, one or more internal caches, one or more shared external caches, and/or to system memory.

In some embodiments, graphics processor 700 also includes a display controller 702 to drive display output data to a display device 720. Display controller 702 includes hardware for one or more overlay planes for the display and composition of multiple layers of video or user interface elements. In some embodiments, graphics processor 700 includes a video codec engine 706 to encode, decode, or transcode media to, from, or between one or more media encoding formats, including, but not limited to Moving Picture Experts Group (MPEG) formats such as MPEG-2, Advanced Video Coding (AVC) formats such as H.264/MPEG-4 AVC, as well as the Society of Motion Picture & Television Engineers (SMPTE) 421M/VC-1, and Joint Photographic Experts Group (JPEG) formats such as JPEG, and Motion JPEG (MJPEG) formats.

In some embodiments, graphics processor 700 includes a block image transfer (BLIT) engine 704 to perform two-dimensional (2D) rasterizer operations including, for example, bit-boundary block transfers. However, in one embodiment, 7D graphics operations are performed using one or more components of graphics processing engine (GPE) 710. In some embodiments, graphics processing engine 710 is a compute engine for performing graphics operations, including three-dimensional (3D) graphics operations and media operations.

In some embodiments, GPE 710 includes a 3D pipeline 712 for performing 3D operations, such as rendering three-dimensional images and scenes using processing functions that act upon 3D primitive shapes (e.g., rectangle, triangle, etc.). The 3D pipeline 712 includes programmable and fixed function elements that perform various tasks within the element and/or spawn execution threads to a 3D/Media sub-system 715. While 3D pipeline 712 can be used to perform media operations, an embodiment of GPE 710 also includes a media pipeline 716 that is specifically used to perform media operations, such as video post-processing and image enhancement.

In some embodiments, media pipeline 716 includes fixed function or programmable logic units to perform one or more specialized media operations, such as video decode acceleration, video de-interlacing, and video encode acceleration in place of, or on behalf of video codec engine 706. In some embodiments, media pipeline 716 additionally includes a thread spawning unit to spawn threads for execution on 3D/Media sub-system 715. The spawned threads perform computations for the media operations on one or more graphics execution units included in 3D/Media sub-system 715.

In some embodiments, 3D/Media subsystem 715 includes logic for executing threads spawned by 3D pipeline 712 and media pipeline 716. In one embodiment, the pipelines send thread execution requests to 3D/Media subsystem 715, which includes thread dispatch logic for arbitrating and dispatching the various requests to available thread execution resources. The execution resources include an array of graphics execution units to process the 3D and media threads. In some embodiments, 3D/Media subsystem 715 includes one or more internal caches for thread instructions and data. In some embodiments, the subsystem also includes shared memory, including registers and addressable memory, to share data between threads and to store output data.

The following examples pertain to further embodiments. Example 1 includes an apparatus comprising: voltage divider logic circuitry to divide a reference voltage; controller logic circuitry, coupled to the voltage divider logic circuitry, to compare a divided voltage value from a node of the voltage divider logic circuitry and a threshold voltage value, wherein a first end of the voltage divider logic circuitry is coupled to receive the reference voltage and a second end of the voltage divider logic circuitry is coupled to a Non-Critical-To-Function (NCTF) solder ball, wherein the controller logic circuitry is to generate an error signal in response to a mismatch between the divided voltage value and the threshold voltage value. Example 2 includes the apparatus of example 1, wherein the threshold voltage value corresponds to voltage value of ground. Example 3 includes the apparatus of example 1, wherein a Printed Circuit Board (PCB) comprises the NCTF solder ball, wherein the NCTF solder ball is to be isolated from a ground plane of the PCB. Example 4 includes the apparatus of example 3, wherein the NCTF solder ball is to be coupled to ground via a processor, a chipset, or memory. Example 5 includes the apparatus of example 3, wherein the NCTF solder ball is located at a perimeter of the PCB. Example 6 includes the apparatus of example 3, wherein the PCB comprises a plurality of Critical-To-Function (CTF) solder balls towards center of the PCB. Example 7 includes the apparatus of example 1, wherein the voltage divider logic circuitry comprises a plurality of resistors. Example 8 includes the apparatus of example 7, wherein each of the plurality of resistors is about 1 k Ohms. Example 9 includes the apparatus of example 1, wherein the voltage divider logic circuitry comprises a plurality of low resistance traces. Example 10 includes the apparatus of example 9, wherein at least two of the plurality of low resistance traces are daisy chained. Example 11 includes the apparatus of example 1, wherein one of an ultra-low power Integrated Circuit (IC) device, a processor, an Embedded Controller (EC), a Board Management Controller (BMC), or an FPGA (Field-Programmable Gate Array) device comprises the controller logic circuitry. Example 12 includes the apparatus of example 1, further comprising a voltage regulator to generate the reference voltage. Example 13 includes the apparatus of example 1, wherein a System On Chip (SOC) device comprises the controller logic circuitry and the voltage divider logic circuitry. Example 14 includes the apparatus of example 1, wherein an Internet of Things (IoT) device or vehicle comprises one or more of: the controller logic circuitry, the voltage divider logic circuitry, and memory. Example 15 includes the apparatus of example 1, wherein a processor, having one or more processor cores, comprises one or more of: the controller logic circuitry, the voltage divider logic circuitry, and memory. Example 16 includes the apparatus of example 1, wherein a single integrated device comprises one or more of: a processor, the controller logic circuitry, the voltage divider logic circuitry, and memory.

Example 17 includes an apparatus comprising: a Printed Circuit Board (PCB) having an NCTF solder ball; and an electronic component coupled to the NCTF solder ball and a ground plane of the PCB, wherein the NCTF solder ball is coupled to voltage divider logic circuitry, wherein the voltage divider logic circuitry is to divide a reference voltage, wherein controller logic circuitry is to compare a divided voltage value from a node of the voltage divider logic circuitry and a threshold voltage value, wherein the controller logic circuitry is to generate an error signal in response to a mismatch between the divided voltage value and the threshold voltage value. Example 18 includes the apparatus of example 17, wherein a first end of the voltage divider logic circuitry is coupled to receive the reference voltage and a second end of the voltage divider logic circuitry is coupled to the NCTF solder ball. Example 19 includes the apparatus of example 17, wherein the electronic component comprises one or more of a processor, having one or more processor cores, a chipset, and memory. Example 20 includes the apparatus of example 17, wherein the threshold voltage value corresponds to voltage value of ground. Example 21 includes the apparatus of example 17, wherein the NCTF solder ball is located at a perimeter of the PCB.

Example 22 includes one or more computer-readable medium comprising one or more instructions that when executed on at least one processor configure the at least one processor to perform one or more operations to cause: voltage divider logic circuitry to divide a reference voltage; controller logic circuitry to compare a divided voltage value from a node of the voltage divider logic circuitry and a threshold voltage value, wherein a first end of the voltage divider logic circuitry is coupled to receive the reference voltage and a second end of the voltage divider logic circuitry is coupled to a Non-Critical-To-Function (NCTF) solder ball, wherein the controller logic circuitry generates an error signal in response to a mismatch between the divided voltage value and the threshold voltage value. Example 23 includes the one or more computer-readable medium of example 22, further comprising one or more instructions that when executed on the at least one processor configure the at least one processor to perform one or more operations to cause a voltage regulator to generate the reference voltage. Example 24 includes the one or more computer-readable medium of example 22, wherein one of an ultra-low power Integrated Circuit (IC) device, a processor, an Embedded Controller (EC), a Board Management Controller (BMC), or an FPGA (Field-Programmable Gate Array) device comprises the controller logic circuitry. Example 25 includes the one or more computer-readable medium of claim 22, wherein the threshold voltage value corresponds to voltage value of ground.

Example 26 includes an apparatus comprising means to perform a method as set forth in any preceding example. Example 27 includes machine-readable storage including machine-readable instructions, when executed, to implement a method or realize an apparatus as set forth in any preceding example.

In various embodiments, the operations discussed herein, e.g., with reference to FIG. 1 et seq., may be implemented as hardware (e.g., logic circuitry or more generally circuitry or circuit), software, firmware, or combinations thereof, which may be provided as a computer program product, e.g., including a tangible (e.g., non-transitory) machine-readable or computer-readable medium having stored thereon instructions (or software procedures) used to program a computer to perform a process discussed herein. The machine-readable medium may include a storage device such as those discussed with respect to FIG. 1 et seq.

Additionally, such computer-readable media may be downloaded as a computer program product, wherein the program may be transferred from a remote computer (e.g., a server) to a requesting computer (e.g., a client) by way of data signals provided in a carrier wave or other propagation medium via a communication link (e.g., a bus, a modem, or a network connection).

Reference in the specification to "one embodiment" or "an embodiment" means that a particular feature, structure, and/or characteristic described in connection with the embodiment may be included in at least an implementation. The appearances of the phrase "in one embodiment" in various places in the specification may or may not be all referring to the same embodiment.

Also, in the description and claims, the terms "coupled" and "connected," along with their derivatives, may be used. In some embodiments, "connected" may be used to indicate that two or more elements are in direct physical or electrical contact with each other. "Coupled" may mean that two or more elements are in direct physical or electrical contact. However, "coupled" may also mean that two or more elements may not be in direct contact with each other, but may still cooperate or interact with each other.

Thus, although embodiments have been described in language specific to structural features and/or methodological acts, it is to be understood that claimed subject matter may not be limited to the specific features or acts described. Rather, the specific features and acts are disclosed as sample forms of implementing the claimed subject matter.

The invention claimed is:

1. An apparatus comprising:
voltage divider logic circuitry to divide a reference voltage;
controller logic circuitry, coupled to the voltage divider logic circuitry, to compare a divided voltage value from a center node of the voltage divider logic circuitry and a threshold voltage value,
wherein a first end of the voltage divider logic circuitry is coupled to receive the reference voltage and a second end of the voltage divider logic circuitry is coupled to a Non-Critical-To-Function (NCTF) solder ball, wherein the controller logic circuitry is to generate an error signal in response to a mismatch between the divided voltage value and the threshold voltage value, wherein the controller logic circuitry comprises one or more Analog-to-Digital Converters (ADCs) to measure one or more voltage values at the center node of the voltage divider logic circuitry.

2. The apparatus of claim 1, wherein the threshold voltage value corresponds to voltage value of ground.

3. The apparatus of claim 1, wherein a Printed Circuit Board (PCB) comprises the NCTF solder ball, wherein the NCTF solder ball is to be isolated from a ground plane of the PCB.

4. The apparatus of claim 3, wherein the NCTF solder ball is to be coupled to ground via a processor, a chipset, or memory.

5. The apparatus of claim 3, wherein the NCTF solder ball is located at a perimeter of the PCB.

6. The apparatus of claim 3, wherein the PCB comprises a plurality of Critical-To-Function (CTF) solder balls towards center of the PCB.

7. The apparatus of claim 1, wherein the voltage divider logic circuitry comprises a plurality of resistors.

8. The apparatus of claim 7, wherein each of the plurality of resistors is about 1 k Ohms.

9. The apparatus of claim 1, wherein the voltage divider logic circuitry comprises a plurality of low resistance traces.

10. The apparatus of claim 9, wherein at least two of the plurality of low resistance traces are daisy chained.

11. The apparatus of claim 1, wherein one of an ultra-low power Integrated Circuit (IC) device, a processor, an Embedded Controller (EC), a Board Management Controller (BMC), or an FPGA (Field-Programmable Gate Array) device comprises the controller logic circuitry.

12. The apparatus of claim 1, further comprising a voltage regulator to generate the reference voltage.

13. The apparatus of claim 1, wherein a System On Chip (SOC) device comprises the controller logic circuitry and the voltage divider logic circuitry.

14. The apparatus of claim 1, wherein an Internet of Things (IoT) device or vehicle comprises one or more of: the controller logic circuitry, the voltage divider logic circuitry, and memory.

15. The apparatus of claim 1, wherein a processor, having one or more processor cores, comprises one or more of: the controller logic circuitry, the voltage divider logic circuitry, and memory.

16. The apparatus of claim 1, wherein a single integrated device comprises one or more of: a processor, the controller logic circuitry, the voltage divider logic circuitry, and memory.

17. An apparatus comprising:
a Printed Circuit Board (PCB) having an NCTF solder ball; and
an electronic component coupled to the NCTF solder ball and a ground plane of the PCB, wherein the NCTF solder ball is coupled to voltage divider logic circuitry, wherein the voltage divider logic circuitry is to divide a reference voltage,
wherein controller logic circuitry is to compare a divided voltage value from a center node of the voltage divider logic circuitry and a threshold voltage value, wherein the controller logic circuitry is to generate an error signal in response to a mismatch between the divided voltage value and the threshold voltage value, wherein the controller logic circuitry comprises one or more Analog-to-Digital Converters (ADCs) to measure one or more voltage values at the center node of the voltage divider logic circuitry.

18. The apparatus of claim 17, wherein a first end of the voltage divider logic circuitry is coupled to receive the reference voltage and a second end of the voltage divider logic circuitry is coupled to the NCTF solder ball.

19. The apparatus of claim 17, wherein the electronic component comprises one or more of a processor, having one or more processor cores, a chipset, and memory.

20. The apparatus of claim 17, wherein the threshold voltage value corresponds to voltage value of ground.

21. The apparatus of claim 17, wherein the NCTF solder ball is located at a perimeter of the PCB.

22. One or more computer-readable medium comprising one or more instructions that when executed on at least one processor configure the at least one processor to perform one or more operations to cause:
voltage divider logic circuitry to divide a reference voltage;
controller logic circuitry to compare a divided voltage value from a center node of the voltage divider logic circuitry and a threshold voltage value,
wherein a first end of the voltage divider logic circuitry is coupled to receive the reference voltage and a second end of the voltage divider logic circuitry is coupled to a Non-Critical-To-Function (NCTF) solder ball, wherein the controller logic circuitry generates an error signal in response to a mismatch between the divided voltage value and the threshold voltage value, wherein the controller logic circuitry comprises one or more Analog-to-Digital Converters (ADCs) to measure one or more voltage values at the center node of the voltage divider logic circuitry.

23. The one or more computer-readable medium of claim 22, further comprising one or more instructions that when executed on the at least one processor configure the at least one processor to perform one or more operations to cause a voltage regulator to generate the reference voltage.

24. The one or more computer-readable medium of claim 22, wherein one of an ultra-low power Integrated Circuit (IC) device, a processor, an Embedded Controller (EC), a Board Management Controller (BMC), or an FPGA (Field-Programmable Gate Array) device comprises the controller logic circuitry.

25. The one or more computer-readable medium of claim 22, wherein the threshold voltage value corresponds to voltage value of ground.

* * * * *